United States Patent
Muller

(10) Patent No.: US 8,085,102 B2
(45) Date of Patent: Dec. 27, 2011

(54) LOW-POWER RELAXATION OSCILLATOR

(75) Inventor: Simon Muller, Bern (CH)

(73) Assignee: EM Microelectronic-Marin S.A., Marin (CH)

( * ) Notice: Subject to any disclaimer, the term of this patent is extended or adjusted under 35 U.S.C. 154(b) by 2 days.

(21) Appl. No.: 12/555,621

(22) Filed: Sep. 8, 2009

(65) Prior Publication Data

US 2010/0066457 A1    Mar. 18, 2010

(30) Foreign Application Priority Data

Sep. 5, 2008   (EP) ..................... 08163797

(51) Int. Cl.
 *H03K 3/26*   (2006.01)
(52) U.S. Cl. ....................... 331/111; 331/143
(58) Field of Classification Search .............. 331/111, 331/143
See application file for complete search history.

(56) References Cited

U.S. PATENT DOCUMENTS

| | | | |
|---|---|---|---|
| 5,070,311 A | 12/1991 | Nicolai | |
| 5,565,819 A * | 10/1996 | Cooper | ........................ 331/111 |
| 5,638,031 A | 6/1997 | Danstrom | |
| 6,157,270 A | 12/2000 | Tso | |
| 6,720,836 B2 | 4/2004 | Lin | |
| 7,030,707 B2 * | 4/2006 | Lee et al. | ...................... 331/143 |
| 7,034,627 B1 | 4/2006 | Kudari | |
| 2005/0077971 A1 | 4/2005 | Bashar | |
| 2007/0279137 A1 | 12/2007 | Molina | |

FOREIGN PATENT DOCUMENTS

EP   0 407 269 A1   1/1991

OTHER PUBLICATIONS

European Search Report issued in corresponding application No. EP 08 16 3797, completed Jan. 9, 2009.

* cited by examiner

*Primary Examiner* — Joseph Chang
(74) *Attorney, Agent, or Firm* — Griffin & Szipl, P.C.

(57) ABSTRACT

The low-power relaxation oscillator comprises a first module (21) having a ramp generator formed by a reference current source (31) and a storage capacitor (32) defining a ramp voltage ($V_{ramp1}$), and a voltage comparator (m1, m2) for comparing the ramp voltage with a reference voltage, a second module (22, 41, 42, $V_{ramp2}$, m3, m4) similar to the first module and an asynchronous flip-flop (23) receiving the output signal of the comparator of the first module at a first input (s) and the output signal of the comparator of the second module at a second input (r). For each module a generator of said reference voltage is configured by adding a reference resistance (33, 43) between the reference current source and the storage capacitor. Thus, the generation of the reference voltage and the ramp voltage is conducted on the very same current branch. This enables the electrical power consumption of the oscillator to be reduced.

6 Claims, 3 Drawing Sheets

LOW-POWER RELAXATION OSCILLATOR

This application claims priority from European Patent Application No. 08163797.7, filed Sep. 5, 2008, the entire disclosure of which is incorporated herein by reference.

TECHNICAL FIELD

The invention relates in general to a relaxation oscillator used in particular in radio-frequency applications. More specifically, the invention relates to a low-power relaxation oscillator that can be integrated into a radio identification transponder (RFID).

TECHNOLOGICAL BACKGROUND

A relaxation oscillator is known from the prior art and its basic diagram is provided in FIG. 1. Such a relaxation oscillator comprises two like modules 1, 2, each having a ramp generator 3, 4 formed by a reference current source 5, 6 and a storage capacitor 7, 8 defining a ramp voltage ($V_{ramp1}$, $V_{ramp2}$), a reference voltage generator 9 and a voltage comparator 10, 11 for comparing the ramp voltage ($V_{ramp1}$, $V_{ramp2}$) with the reference voltage ($V_{ref}$). An asynchronous RS type flip-flop 12 receives the output signal of the comparator 10 of the first module at a first input (s) and the output signal of the comparator 11 of the second module 2 at a second input (r). Then as a result of the bias of the output terminals q and qb the flip-flop 12 alternately supplies control signals for charging the capacitor 7 of the first module and for charging the storage capacitor 8 of the second module. For this, each ramp generator 3, 4 is controlled by means of a switch 13, 14.

The operation of such a relaxation oscillator is described in association with FIG. 2 that shows the ramp voltages ($V_{ramp1}$, $V_{ramp2}$) in relation to time. In an initial stage, the switch 13 is open, the reference current source 5 charges the storage capacitor 7 by means of the reference current $I_{ref}$. At the same stage, the switch 14 is closed so that the storage capacitor 8 is short-circuited and is therefore not charged. When the ramp voltage $V_{ramp1}$ reaches the level of the reference voltage $V_{ref}$, the voltage comparator 10 detects this and the signal that it outputs is modified so that the flip-flop 12 changes state. The output signals at terminals q and qb are inverted. Thus, switches 13 and 14 are closed and open respectively. The charge stored on the capacitor 7 is then discharged to Vss by short-circuit, while charging the capacitor 8 begins. Similarly, when the ramp voltage $V_{ramp2}$ reaches the level of the reference voltage $V_{ref}$, the voltage comparator 11 detects this and the signal that it outputs is modified so that the flip-flop 12 changes state. The output signals at terminals q and qb are once again inverted and the initial cycle can start again. These two charge phases successively of capacitor 7 and capacitor 8 represent an oscillation period.

Another relaxation oscillator of the prior art is described in patent document U.S. Pat. No. 6,720,836. This document describes a relaxation oscillator with current sources coupled to one another.

For radio-frequency identification applications involving RFID transponders, the consumption of current sources used in such relaxation oscillators is one of the most critical parameters. The theoretical minimum current consumption for such a relaxation oscillator is given by the formula $C*V_{ref}/T=I_{ref}$. To minimise current consumption for a set oscillation period, the storage capacitor C and the reference voltage $V_{ref}$ must be reduced to the full. For this purpose, it is important to note that the reference voltage $V_{ref}$ corresponds to the oscillation amplitude.

The existing solutions have one or more disadvantages listed below and are therefore further removed from the theoretical minimum consumption.

Firstly, an oscillator like that shown in FIG. 1 consumes the equivalent of the theoretical minimum current consumption just with the ramp generator (via the source of reference current $I_{ref}$). Therefore, all the other consumer circuits will take such an oscillator further away from the theoretical minimum consumption. These other consumer circuits comprise in particular the reference voltage generator, comparators of the ramp voltage with the reference voltage.

An oscillator such as that described in patent document U.S. Pat. No. 6,720,836 has the major disadvantage of having an oscillation amplitude associated with the gate-source voltage $V_{gs}$ of a CMOS type transistor that can thus not be decreased in order to reduce current consumption. Moreover, such a relaxation oscillator uses a current mirror with a size ratio of 1 to 10 between the transistors of the mirror, and this requires a significant surface over an integrated circuit.

In addition, it must also be noted that the voltage amplitude is only in theory equal to $V_{ref}$. In reality, a phenomenon of overrun occurs in the switching phases as a result of the reaction time of the comparators. This is the case in particular in oscillator solutions using transistors that do not operate fully in saturated mode.

Finally, the minimum value for the storage capacitor is determined in particular by the value of the interference capacitor on the upper plate of the storage capacitor. These interference capacitors come from metal connections and other devices connected to the upper plate of the storage capacitor. Previous solutions based in particular on the Vittoz loop connect numerous or extensive devices to this capacitor. The operation of these devices in weak inversion increases the capacitor compared to an operation of these devices in strong inversion. Therefore, it will be important to ensure that a limited storage capacitor is maintained.

SUMMARY OF THE INVENTION

An aim of the present invention is to address the disadvantages mentioned above by providing a low-power relaxation oscillator, i.e. one with a reduced current consumption as close as possible to the theoretical minimum consumption without compromising the supply voltage and the temperature stability.

In this aim, a first aspect of the present invention relates to a low-power relaxation oscillator comprising a first module having a ramp generator formed by a reference current source and a storage capacitor supplied by the reference current source via a reference current branch and defining a ramp voltage, and a voltage comparator for comparing the ramp voltage with a reference voltage, a second module similar to the first module and an asynchronous flip-flop receiving the output signal of the comparator of the first module at a first input and the output signal of the comparator of the second module at a second input and alternately outputting control signals for charging the capacitor of the first module and the capacitor of the second module. This relaxation oscillator is characterised in that for each of the first and second modules a reference voltage generator is configured by adding a reference resistance arranged on said reference current branch in such a manner that the reference voltage is defined by the reference current flowing through the reference resistance.

Because of the features of the oscillator according to the invention, the generation of the reference voltage and the storage capacitor are arranged on the very same current branch between the two poles of supply of this oscillator. The arrangement of the reference resistance in the oscillator according to the invention generates a single comparator threshold. The arrangement of the reference resistance in the reference current branch is all the more advantageous because the reference current supplied by the reference current source, in a classic application, is virtually independent of the supply voltage. The reference current passing through the reference resistance and the current charging the storage capacitor then form the very same current. In other words, the reference voltage and the ramp voltage are generated by the same reference current passing through the very same reference current branch. This reduces the electrical power consumption of the oscillator significantly.

According to a preferred embodiment, the comparator is configured by a modified current mirror comprising two transistors, of which a first is integrated into the reference current branch between the reference resistance and the storage capacitor and the second is integrated into a comparison current branch supplied by a source of dynamic comparison current.

As a result of these particular features of the invention, the minimum operating voltage of the oscillator is relatively low. It is composed of the saturation voltage of the source of reference current, of reference voltage and of gate-source voltage of the first transistor. The saturation voltage is low, much lower than the gate-source voltage of a typical transistor, and the reference voltage can be low. The consumption of the oscillator is minimal and its operating voltage is low. Thus, a low-power oscillator is provided in reality.

According to a preferred embodiment, the reference resistance is arranged between the drain and the gate of the first transistor. This first transistor is thus diode-connected but with the reference resistance interposed between its drain and its gate. The gate of the second transistor is connected to the drain of the first transistor.

According to an advantageous variant, the transistor present in the comparison current branch is arranged in a cascode configuration with an additional transistor.

According to another advantageous embodiment, the reference current source of the first module and that of the second module is the very same reference current source used to alternately supply the first and the second module respectively on the basis of control signals delivered to the output of the asynchronous flip-flop.

BRIEF DESCRIPTION OF THE FIGURES

Other features and advantages of the present invention will become clearer after reading the following detailed description of the embodiments of the invention given by way of fully non-restrictive example and illustrated by the attached drawings, wherein.

DETAILED DESCRIPTION OF THE INVENTION

Figure 3:
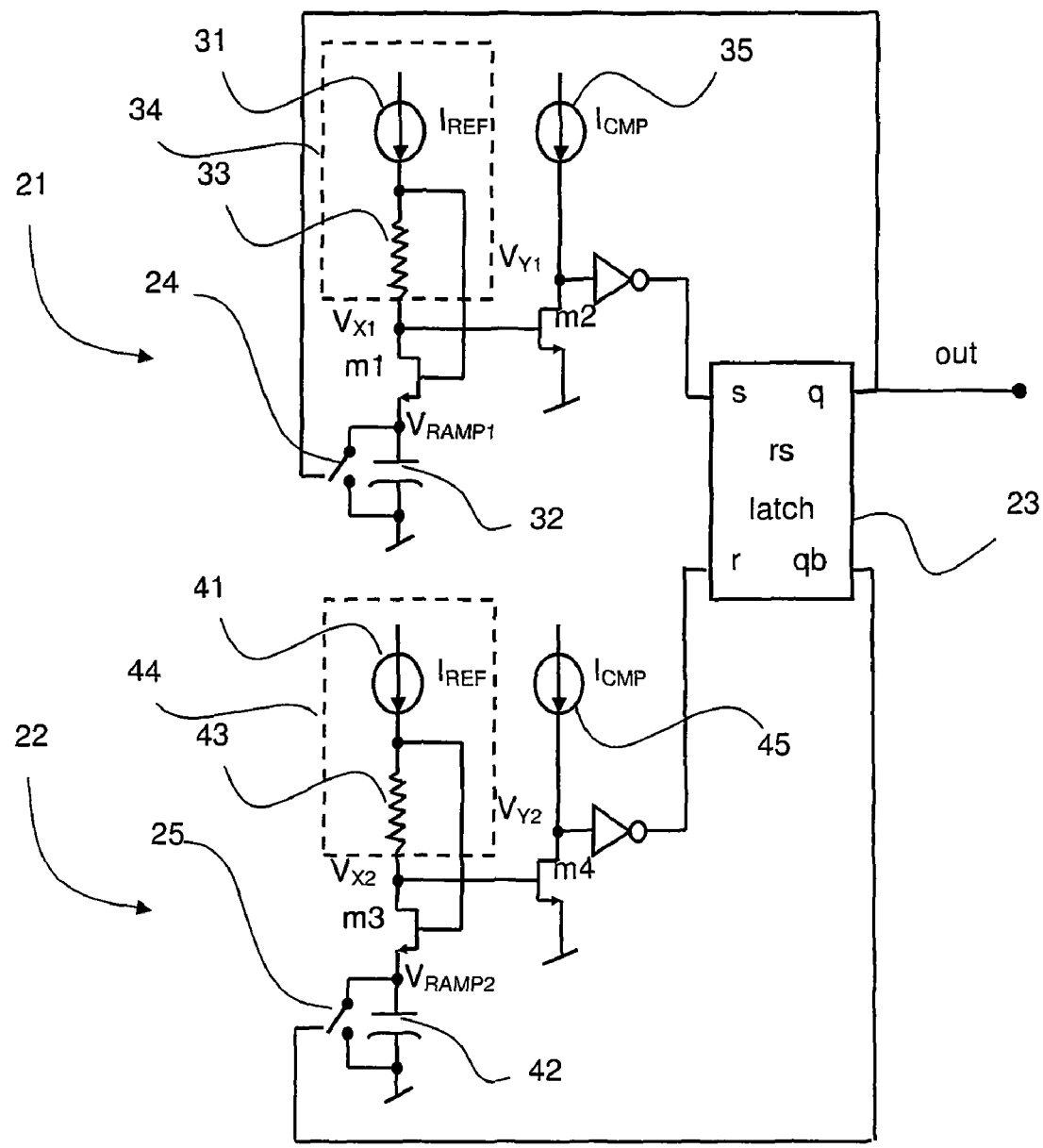
FIG. 3 shows a low-power relaxation oscillator according to a first embodiment of the present invention.

The invention will be described below solely on the basis of non-restrictive examples in association of FIGS. 3 and 4. FIG. 3 shows a low-power relaxation oscillator according to a first embodiment of the invention. The overall structure of the relaxation oscillator according to this first embodiment is still like that presented in association with the base relaxation oscillator according to the prior art. Two like modules 21, 22 are evident that each comprise a ramp generator, a generator of a reference (voltage?) and a comparator. The output of each of these two modules is then connected to the input terminals of an asynchronous flip-flop 23, the outputs of which are relooped onto the input of each of the modules. However, the present invention differs from the oscillator according to the prior art by the configuration of the modules. In particular, an advantageous combination of the ramp generator with the generator of a reference voltage and the comparator is provided in order to reduce the current consumption of the module to a minimum.

We will now describe the first module 21 in detail and this description will apply equally to the second module 22. The ramp generator is still based on the principle of charging a storage capacitor 32 by means of a reference current $I_{ref}$ from a source of reference current 31.

The generator of a reference voltage 34 is advantageously integrated into the ramp generator by the introduction of a reference resistance 33 in series with the reference current source 31. Thus, the reference current $I_{ref}$ passes through the resistance so that the voltage at its terminals becomes a reference voltage $V_{ref}$. It will be noted that the amplitude of oscillations can be chosen arbitrarily by the choice of reference resistance for this purpose.

At the same time, the comparator is formed by two transistors m1 and m2, of which the first transistor m1 is integrated into the reference current branch, i.e. that having the reference current $I_{ref}$ flowing through it, so that it does not cause any additional consumption of current, and the second transistor is integrated into a comparison current branch supplied by a source of dynamic comparison current 35, i.e. in which the comparison current $I_{cmp}$ is produced and consumed solely during the short instants of comparison. The two transistors m1 and m2 thus form a current mirror. More specifically, the current terminals (source and drain) of the first transistor m1 are connected between the reference resistance 33 and the storage capacitor 32 and the control terminal (gate) is connected between the reference resistance 33 and the reference current source 31. Transistor m1 is used in strong inversion. With respect to transistor m2, its current terminals are connected between earth, in particular $V_{ss}$, and the source of dynamic comparison current 35 and its control terminal is connected to the reference current branch between the reference resistance and transistor m1 (i.e. the drain of this transistor m1). It will be noted that the capacitor 32 is also connected to earth, i.e. at the same reference voltage as a current terminal of transistor m2. Transistor m2 is in saturation mode during comparison when the output of the comparator, defined by the current terminal (drain) connected to the comparison current source, is close to the reference supply voltage $V_{dd}$ at the beginning of the comparison. The output of the comparator is preferably amplified in an inverter (or in one variant a plurality thereof) that is a low current consumer and is then input into an asynchronous flip-flop 23.

The asynchronous flip-flop is an RS type, for example. This flip-flop 23 thus receives the output of the comparator of the first module 21 at a first input (s) and the output of the comparator of the second module 22 at a second input (r) and outputs control signals to alternately charge the storage capacitor of the first module and the storage capacitor of the second module by means of opposed outputs (q) and (qb) that alternately switch switches 24 and 25.

Such an oscillator has proved very advantageous in that it only requires a reference current source that enables the storage capacitor to be charged and also the reference voltage to be supplied for the comparator. Moreover, the comparator is integrated so that the first transistor m1, i.e. that in the reference current branch, does not consume additional current and so that the second transistor m2, i.e. that in the dynamic current branch, only consumes current during the transition of the comparator when the ramp voltage reaches the reference voltage.

We will now describe the operation of the relaxation oscillator of FIG. 3 in relation to time. For this, the important voltages to be considered are the ramp voltages $V_{ramp1}$ and $V_{ramp2}$ in comparison with the reference voltage $V_{ref}$, as well as the potential of the nodes $V_{x1}$, $V_{y1}$ with respect to the first module 21 and $V_{x2}$, $V_{y2}$ with respect to the second module 22.

The voltage at the node $V_{x1} = V_{ramp1} + V_{gs} - V_{ref}$, where $V_{gs}$ is the gate-source voltage of transistor m1 and $V_{ref}$ is the reference voltage, i.e. $I_{ref}*R$. At the start, the switch 24 is closed, short-circuiting the storage capacitor 32 that is then discharged. Transistor m1 is conductive while transistor m2 is non-conductive. Thus, the ramp voltage $V_{ramp1}$ is zero as is the comparison current $I_{cmp}$. In the same period, the voltage at the node $V_{y1} = V_{dd}$. It is understood that the presence of the dynamic comparison current source allows the node $V_{y1}$ to be kept at a defined voltage ($V_{dd}$) without then consuming current outside of the comparison, i.e. during the transition that will be explained below.

Then upon instruction from the flip-flop via the control signal q, switch 24 is opened and in parallel switch 25 is closed via the control signal qb. The storage capacitor 32 of the first module 21 is then charged and in parallel the voltage $V_{ramp1}$ increases and the storage capacitor 42 of the second module 22 is abruptly discharged because of the short-circuiting by switch 25. The second module 22 is then in the initial state described above for the first module, i.e. $V_{ramp2}=0$ and $V_{y2}=V_{dd}$. The signal output by the second module 22 to the flip-flop 23 is then inverted.

Figure 1:
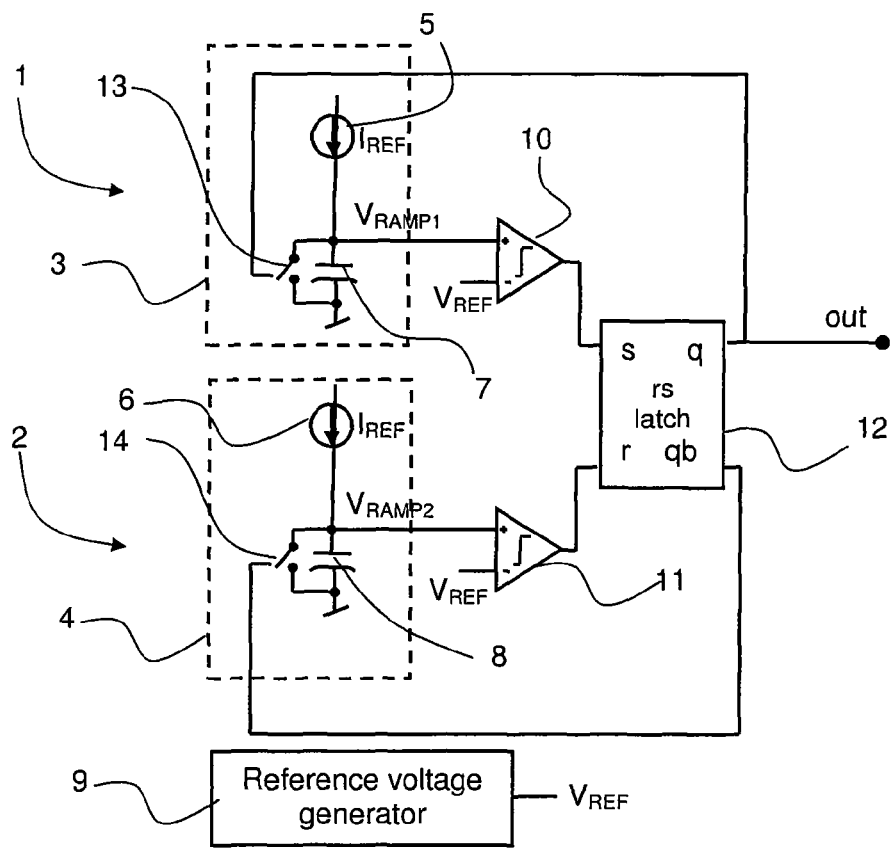
FIG. 1 as already described, shows a relaxation oscillator according to the prior art.
Figure 2:
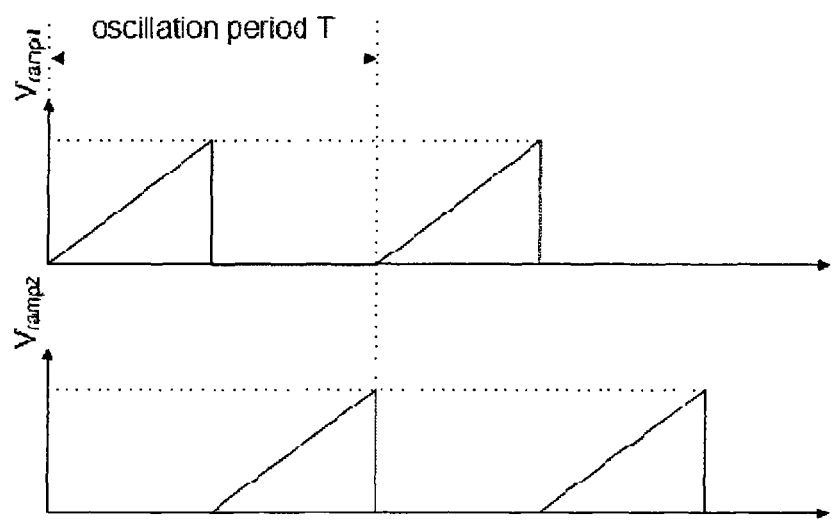
FIG. 2 as already described, shows the development of the ramp voltages of a basic relaxation oscillator in relation to time.

When the ramp voltage $V_{ramp1}$ reaches the level of the reference voltage $V_{ref}$, the voltage at the node $V_{x1}$ becomes equal to the voltage $V_{gs}$. Transistor m2 then becomes conductive. As a result of this, the voltage at the node $V_{y1}$ drops to $V_{ss}$. The signal output by the comparator of the first module to the flip-flop 23 is thus inverted. Since the signal received at the input terminal (s) of the flip-flop has been inverted, outputs q and qb are themselves inverted so that the switch 24 is closed. The signal received at the input terminal (r) of the flip-flop is then itself inverted. A cycle resembling that just described for the first module starts for the second module and so on. Thus, the development of the ramp voltages over time is similar to that shown in FIG. 2. The oscillation period is given by the formula:

$$T = C*V_{ref}/I_{ref};$$

where $V_{ref} = R*I_{ref}$, the above formula can read as follows:

$$T = R*C.$$

Thus, the oscillation period T is only dependent on the reference resistance R and the storage capacitor C. The temperature coefficient of the capacitor is generally negligible and that of the resistance is relatively low. There therefore results an oscillator of low consumption without thus interfering with the supply voltage and the temperature stability.

Figure 4:
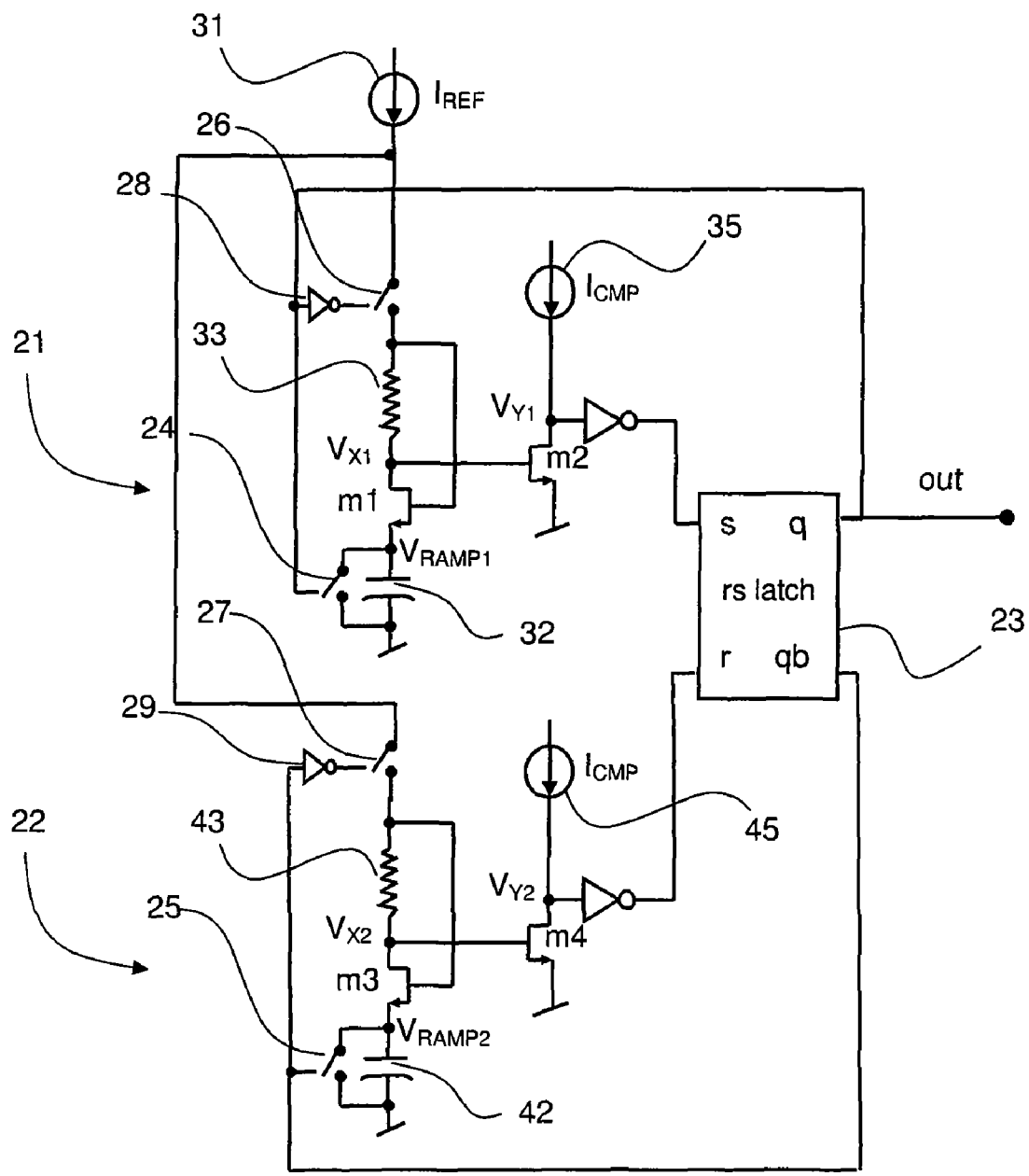
FIG. 4 shows a low-power relaxation oscillator according to a second embodiment of the present invention.

FIG. 4 shows a low-power relaxation oscillator according to a second embodiment of the present invention. This embodiment is the same as the embodiment shown in FIG. 3 in every aspect except for the sources of reference current used. In this oscillator according to this second embodiment, an advantageous provision is to only use a single reference current source 31 common to both modules 21 and 22 in order to reduce current consumption even further. For this, switches 26 and 27 are integrated between the common source of reference current 31 and the reference resistance 33 of the first module and the reference resistance 43 of the second module respectively. Inverters 28 and 29 are provided to control these two switches 26 and 27 to ensure that the reference current source supplies the current for charging the capacitor 32, and 42 in turn, when they are not short-circuited.

It is understood that various modifications and/or improvements evident to a person skilled in the art can be applied to the various embodiments of the invention described in the present description without departing from the framework of the invention as defined by the attached claims. In particular, a cascode configuration could be used instead of the transistor (m2, m4) present in the comparison current branch of the modules.

What is claimed is:

1. A low-power relaxation oscillator comprising:
   (a) a first module having a ramp generator formed by a reference current source and a storage capacitor supplied by the reference current source via a reference current branch and defining a ramp voltage, and a voltage comparator for comparing the ramp voltage with a reference voltage,
   (b) a second module having a ramp generator formed by a reference current source and a storage capacitor supplied by the reference current source via a reference current branch and defining a ramp voltage, and a voltage comparator for comparing the ramp voltage with a reference voltage, and
   (c) an asynchronous flip-flop receiving the output signal of the comparator of the first module at a first input and the output signal of the comparator of the second module at a second input and alternately outputting control signals for charging the capacitor of the first module and the capacitor of the second module,
   wherein for each module a generator of said reference voltage is configured by adding a reference resistance arranged on said reference current branch in such a manner that the reference voltage is defined by the reference current flowing through this reference resistance.

2. The relaxation oscillator according to claim 1, wherein the comparator is configured by a modified current mirror comprising two transistors, of which a first transistor is integrated into the reference current branch between the reference resistance and the storage capacitor and a second transistor is integrated into a comparison current branch supplied by a source of dynamic comparison current.

3. The relaxation oscillator according to claim 2, wherein said reference resistance is arranged between the drain and the gate of said first transistor.

4. The relaxation oscillator according to claim 3, wherein the gate of the second transistor is connected to the drain of the first transistor.

5. The relaxation oscillator according to claim 2, wherein said second transistor is arranged in a cascode configuration with an additional transistor.

6. The relaxation oscillator according to claim 1, wherein the reference current source of the first module and that of the second module is the same reference current source used to alternately supply the first module and the second module respectively on the basis of control signals delivered to the output of the asynchronous flip-flop.

* * * * *